(12) United States Patent
Luo et al.

(10) Patent No.: US 11,610,524 B2
(45) Date of Patent: Mar. 21, 2023

(54) SHIFT REGISTER UNIT AND DRIVING METHOD THEREOF, GATE DRIVE CIRCUIT AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hao Luo, Beijing (CN); Like Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 753 days.

(21) Appl. No.: 16/470,534

(22) PCT Filed: Nov. 19, 2018

(86) PCT No.: PCT/CN2018/116263
§ 371 (c)(1),
(2) Date: Jun. 17, 2019

(87) PCT Pub. No.: WO2019/218625
PCT Pub. Date: Nov. 21, 2019

(65) Prior Publication Data
US 2021/0358361 A1 Nov. 18, 2021

(30) Foreign Application Priority Data
May 16, 2018 (CN) .......................... 201810470216.2

(51) Int. Cl.
*G09G 3/20* (2006.01)
*G11C 19/28* (2006.01)
(Continued)

(52) U.S. Cl.
CPC ............. *G09G 3/20* (2013.01); *G09G 3/3677* (2013.01); *G11C 19/28* (2013.01); *G11C 19/287* (2013.01);
(Continued)

(58) Field of Classification Search
CPC ..... G09G 2310/0286; G09G 2310/061; G09G 2310/0267; G09G 2310/08; G09G 3/3677;
(Continued)

(56) References Cited

U.S. PATENT DOCUMENTS 8,766,958 B2 * 7/2014 Zhang ................. G09G 3/3677
345/204
9,842,566 B2 12/2017 Lee
(Continued)

FOREIGN PATENT DOCUMENTS

CN 102930814 A 2/2013
CN 104575436 A 4/2015
(Continued)

OTHER PUBLICATIONS

International Search Report and Written Opinion dated Feb. 13, 2019; PCT/CN2018/116263.
(Continued)

*Primary Examiner* — Dismery Mercedes

(57) ABSTRACT

A shift register unit and a driving method thereof, a gate drive circuit and a display device. The shift register unit includes a first input circuit, an output circuit and a first output pull-down circuit. The first input circuit is configured to charge a pull-up node in response to a first clock signal and reset the pull-up node in response to the first clock signal; the output circuit is configured to output a second clock signal to an output terminal under a control of a level of the pull-up node; the first output pull-down circuit is
(Continued)

configured to denoise the output in response to a third clock signal.

16 Claims, 7 Drawing Sheets

(51) Int. Cl.
    *G06F 3/041*     (2006.01)
    *G09G 3/36*     (2006.01)

(52) U.S. Cl.
    CPC . *G09G 2300/0426* (2013.01); *G09G 2300/08* (2013.01); *G09G 2310/0267* (2013.01); *G09G 2310/0283* (2013.01); *G09G 2310/0286* (2013.01); *G09G 2310/08* (2013.01)

(58) Field of Classification Search
    CPC .................. G09G 3/20; G09G 3/3266; G09G 2320/0209; G09G 2320/0233; G09G 3/3225; G09G 3/3674; G09G 2310/0289; G09G 2310/067; G09G 2310/06; G09G 2310/0283; G09G 2310/0243; G09G 3/3648; G11C 19/287; G11C 19/28
    See application file for complete search history.

(56) References Cited

U.S. PATENT DOCUMENTS

| | | | |
|---|---|---|---|
| 10,417,983 B2 | 9/2019 | Hu et al. | |
| 10,796,654 B2* | 10/2020 | Wang | G09G 3/3677 |
| 10,964,243 B2* | 3/2021 | Yuan | G09G 3/20 |
| 11,011,088 B2* | 5/2021 | Liao | G11C 19/28 |
| 11,295,645 B2* | 4/2022 | Ma | G11C 19/28 |
| 2010/0245298 A1* | 9/2010 | Chen | G09G 3/3677 |
| | | | 345/204 |
| 2014/0119491 A1* | 5/2014 | Liu | G11C 19/28 |
| | | | 377/64 |
| 2014/0169518 A1* | 6/2014 | Kong | G09G 3/3674 |
| | | | 377/64 |
| 2014/0355733 A1* | 12/2014 | Kim | G11C 19/28 |
| | | | 377/67 |
| 2016/0133337 A1* | 5/2016 | Gu | G09G 3/00 |
| | | | 377/64 |
| 2016/0210925 A1 | 7/2016 | Chung et al. | |
| 2016/0314850 A1* | 10/2016 | Gu | G11C 19/28 |
| 2017/0053614 A1 | 2/2017 | Abe et al. | |
| 2017/0092172 A1* | 3/2017 | Wang | G09G 3/20 |
| 2017/0092376 A1* | 3/2017 | Wang | G11C 19/28 |
| 2017/0193885 A1* | 7/2017 | Feng | G11C 19/28 |
| 2018/0151148 A1* | 5/2018 | Wu | G09G 3/20 |
| 2018/0357974 A1* | 12/2018 | Zheng | G09G 3/36 |
| 2019/0189233 A1* | 6/2019 | Su | G09G 3/20 |
| 2020/0090610 A1* | 3/2020 | Wang | G11C 19/28 |
| 2021/0272491 A1* | 9/2021 | Wang | G09G 3/3677 |

FOREIGN PATENT DOCUMENTS

| | | |
|---|---|---|
| CN | 104867435 A | 8/2015 |
| CN | 105261341 A | 1/2016 |
| CN | 105405417 A | 3/2016 |
| CN | 106531048 A | 3/2017 |
| CN | 106782282 A | 5/2017 |
| CN | 107689219 A | 2/2018 |
| KR | 1020170114621 A | 10/2017 |

OTHER PUBLICATIONS

First Chinese Office Action dated Mar. 12, 2010; Appln. No. 201810470216.2.

* cited by examiner

SHIFT REGISTER UNIT AND DRIVING METHOD THEREOF, GATE DRIVE CIRCUIT AND DISPLAY DEVICE

This application claims priority to Chinese Patent Application No. 201810470216.2, filed on May 16, 2018, the disclosure of which is incorporated herein by reference in its entirety as part of this application.

TECHNICAL FIELD

The embodiments of the present disclosure relate to a shift register unit and a driving method thereof, a gate drive circuit and a display device.

BACKGROUND

In the field of display technology, the pixel array of a liquid crystal display panel, as an example, generally includes numerous rows of gate lines and numerous columns of data lines intersecting with the gate lines. The gate line may be driven by a gate drive circuit. For example, the gate drive circuit may be implemented by a bonded integrated driver circuit. In recent years, with the continuous improvement of the preparation process of amorphous silicon thin film transistors or oxide thin film transistors, the gate drive circuit may also be directly integrated on the thin film transistor array substrate to form a GOA (Gate-driver On Array) to drive the gate lines. For example, a GOA comprises a plurality of cascaded shift register units may be used to provide on-state voltage signals or off-state voltage signals to the multi-row gate lines of the pixel array, so as to, for example, control the multi-row gate lines to be sequentially turned on, and allow data signals to be provided to the pixel units of corresponding rows in the pixel array from the data lines to control each pixel unit to display a frame of image. Nowadays, more and more display panels adopt the GOA technology to drive gate lines. The GOA technology helps to realize narrow bezels and may reduce production costs.

SUMMARY

At least one embodiment of the present disclosure provides a shift register unit including a first input circuit, an output circuit, and a first output pull-down circuit, wherein the first input circuit is configured to charge a pull-up node in response to a first clock signal and reset the pull-up node in response to the first clock signal, the output circuit is configured to output a second clock signal to an output terminal under a control of a level of the pull-up node, and the first output pull-down circuit is configured to denoise the output terminal in response to a third clock signal.

For example, the shift register unit provided by an embodiment of the present disclosure further includes a second input circuit, wherein the second input circuit is configured to denoise the pull-up node in response to a fourth clock signal.

For example, the shift register unit provided by an embodiment of the present disclosure further includes a first pull-down node control circuit and a second output pull-down circuit, wherein the first pull-down node control circuit is configured to control a level of a pull-down node under a control of the level of the pull-up node, and the second output pull-down circuit is configured to denoise the output terminal under a control of the level of the pull-down node For example, the shift register unit provided by an embodiment of the present disclosure further includes a second pull-down node control circuit, wherein the second pull-down node control circuit is configured to control the level of the pull-down node in response to the second clock signal.

For example, in the shift register unit provided by an embodiment of the present disclosure, the first input circuit includes a first transistor, a gate of the first transistor is configured to be connected to a first clock signal terminal to receive the first clock signal, a first electrode of the first transistor is configured to be connected to a first input terminal to receive a first input signal, and a second electrode of the first transistor is configured to be connected to the pull-up node.

For example, in the shift register unit provided by an embodiment of the present disclosure, the output circuit includes a second transistor and a first capacitor, a gate of the second transistor is configured to be connected to the pull-up node, a first electrode of the second transistor is configured to be connected to a second clock signal terminal to receive the second clock signal, and a second electrode of the second transistor is configured to be connected to the output terminal, and a first electrode of the first capacitor is configured to be connected to the gate of the second transistor, and a second electrode of the first capacitor is configured to be connected to the second electrode of the second transistor.

For example, in the shift register unit provided by an embodiment of the present disclosure, the first output pull-down circuit includes a third transistor, a gate of the third transistor is configured to be connected to a third clock signal terminal to receive the third clock signal, a first electrode of the third transistor is configured to be connected to the output terminal, and a second electrode of the third transistor is configured to be connected to a first voltage terminal to receive a first voltage.

For example, in the shift register unit provided by an embodiment of the present disclosure, the second input circuit includes a fourth transistor, a gate of the fourth transistor is configured to be connected to a fourth clock signal terminal to receive the fourth clock signal, a first electrode of the fourth transistor is configured to be connected to the pull-up node, and a second electrode of the fourth transistor is configured to be connected to a second input terminal to receive a second input signal.

For example, in the shift register unit provided by an embodiment of the present disclosure, the first pull-down node control circuit includes a fifth transistor, a gate of the fifth transistor is configured to be connected to the pull-up node, a first electrode of the fifth transistor is configured to be connected to the pull-down node, and a second electrode of the fifth transistor is configured to be connected to a first voltage terminal to receive a first voltage.

For example, in the shift register unit provided by an embodiment of the present disclosure, the second output pull-down circuit includes a sixth transistor, a gate of the sixth transistor is configured to be connected to the pull-down node, a first electrode of the sixth transistor is configured to be connected to the output terminal, and a second electrode of the sixth transistor is configured to be connected to a first voltage terminal to receive a first voltage.

For example, in the shift register unit provided by an embodiment of the present disclosure, the second pull-down node control circuit includes a second capacitor, a first electrode of the second capacitor is configured to be connected to the pull-down node, and a second electrode of the second capacitor is configured to be connected to a second clock signal terminal to receive the second clock signal.

At least one embodiment of the present disclosure further provides a gate drive circuit including the shift register unit according to any embodiment of the present disclosure.

For example, the gate drive circuit provided by an embodiment of the present disclosure includes a first clock signal line, a second clock signal line, a third clock signal line, and a fourth clock signal line, wherein in a case where the shift register unit includes a second input circuit, the shift register unit further includes a first clock signal terminal, a second clock signal terminal, a third clock signal terminal, and a fourth clock signal terminal, wherein the first clock signal terminal, the second clock signal terminal, the third clock signal terminal, and the fourth clock signal terminal are configured for inputting the first clock signal, the second clock signal, the third clock signal, and a fourth clock signal into the first input circuit, the output circuit, the first output pull-down circuit, and a second input circuit, respectively, the first clock signal terminal of the shift register unit of a (4n-3)th stage is connected with the first clock signal line, the second clock signal terminal of the shift register unit of the (4n-3)th stage is connected with the second clock signal line, the third clock signal terminal of the shift register unit of the (4n-3)th stage is connected with the third clock signal line, and the fourth clock signal terminal of the shift register unit of the (4n-3)th stage is connected with the fourth clock signal line, the first clock signal terminal of the stage shift register unit of a (4n-2)th stage is connected with the second clock signal line, the second clock signal terminal of the (4n-2)th stage shift register unit is connected with the fourth clock signal line, the third clock signal terminal of the (4n-2)th stage shift register unit is connected with the first clock signal line, and the fourth clock signal terminal of the shift register unit of the (4n-2)th stage is connected with the third clock signal line, the first clock signal terminal of the stage shift register unit of a (4n-1)th stage is connected with the fourth clock signal line, the second clock signal terminal of the (4n-1)th stage shift register unit is connected with the third clock signal line, the third clock signal terminal of the shift register unit of the (4n-1)th stage is connected with the second clock signal line, and the fourth clock signal terminal of the shift register unit of the (4n-1)th stage is connected with the first clock signal line, the first clock signal terminal of the shift register unit of a (4n)th stage is connected with the third clock signal line, the second clock signal terminal of the 4n-th stage shift register unit is connected with the first clock signal line, the third clock signal terminal of the 4n-th stage shift register unit is connected with the fourth clock signal line, and the fourth clock signal terminal of the shift register unit of the (4n)th stage is connected with the second clock signal line, and n is an integer greater than 0.

At least one embodiment of the present disclosure further provides a display device including the gate drive circuit according to any embodiment of the present disclosure.

At least one embodiment of the present disclosure further provides a driving method of the shift register unit according to any embodiment of the present disclosure, in a case where the shift register unit includes a second output pull-down circuit, the driving method includes:

in a first phase, charging by the first input circuit the pull-up node to a first level in response to the first clock signal, and outputting by the output circuit a low level of the second clock signal to the output terminal;

in a second phase, outputting by the output circuit a high level of the second clock signal to the output terminal;

in a third phase, outputting by the output circuit the high level of the second clock signal to the output terminal;

in a fourth phase, outputting by the output circuit a low level of the second clock signal to the output terminal, and denoising by the first output pull-down circuit the output terminal in response to the third clock signal;

in a fifth phase, resetting by the first input circuit the pull-up node in response to the first clock signal, and denoising by the first output pull-down circuit the output terminal in response to the third clock signal; and in a sixth phase, resetting by the first input circuit the pull-up node in response to the first clock signal, and denoising by the second output pull-down circuit the output terminal under a control of a level of a pull-down node.

For example, in the driving method of the shift register unit provided by an embodiment of the present disclosure, in a case where the shift register unit further includes a second input circuit, the driving method further includes: in a seventh phase, denoising by the second input circuit the pull-up node in response to a fourth clock signal, and denoising by the second output pull-down circuit the output terminal under the control of the level of the pull-down node.

For example, in the driving method of the shift register unit provided by an embodiment of the present disclosure, the first clock signal, the second clock signal, the third clock signal and the fourth clock signal have a same period, a phase of the second clock signal is one quarter of the period later than a phase of the first clock signal, a phase of the fourth clock signal is one quarter of the period later than the phase of the second clock signal, and a phase of the third clock signal is one quarter of the period later than the phase of the fourth clock signal.

At least one embodiment of the present disclosure also provides a driving method of the shift register unit according to any embodiment of the present disclosure, in a case where the shift register unit includes a second output pull-down circuit, the driving method includes:

in a first phase, charging by the second input circuit the pull-up node to a first level in response to the fourth clock signal, and outputting by the output circuit a low level of the second clock signal to the output terminal;

in a second phase, outputting by the output circuit a high level of the second clock signal to the output terminal;

in a third phase, outputting by the output circuit the high level of the second clock signal to the output terminal;

in a fourth phase, outputting by the output circuit the low level of the second clock signal to the output terminal, and denoising by the first output pull-down circuit the output terminal in response to the third clock signal;

in a fifth phase, resetting by the second input circuit the pull-up node in response to the fourth clock signal, and denoising by the first output pull-down circuit the output terminal in response to the third clock signal; and in a sixth phase, resetting by the second input circuit the pull-up node in response to the fourth clock signal, and denoising by the second output pull-down circuit the output terminal under a control of a level of the pull-down node.

For example, the driving method of the shift register unit provided by an embodiment of the present disclosure includes: in a seventh phase, denoising by the first input circuit the pull-up node in response to the first clock signal, and denoising by the second output pull-down circuit the output terminal under the control of the level of the pull-down node.

For example, in the driving method of the shift register unit provided by an embodiment of the present disclosure, the first clock signal, the second clock signal, the third clock signal and the fourth clock signal have a same period, a phase of the first clock signal is one quarter of the period later than a phase of the second clock signal, a phase of the third clock signal is one quarter of the period later than the phase of the first clock signal, and a phase of the fourth clock signal is one quarter of the period later than the phase of the third clock signal.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
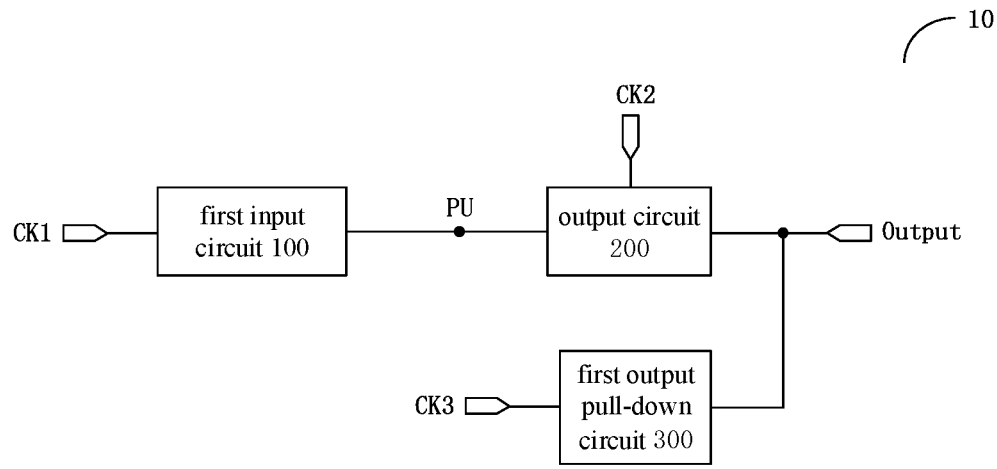
FIG. 1 is a schematic block diagram of a shift register unit provided by an embodiment of the present disclosure.

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With more and more applications of display panel related products, the demands for display panels are also increasingly diversified. For example, some customers hope that the display panels may realize a pre-charging function to shorten the data writing time and improve the accuracy of data writing. For example, another part of customers want the gate drive circuit in the display panel to have a simple circuit structure and use as few components as possible, so as to realize the arrangement of wires in narrow bezel and high resolution display panels. For example, another part of customers hope that the display panel may scan forward and backward to realize the bidirectional scanning function, so that the display panel may display upright images regardless of whether it is placed upside down. These diverse requirements pose challenges to the design of gate drive circuits.

At least one embodiment of the present disclosure provides a shift register unit, a driving method thereof, a gate drive circuit, and a display device. The number of transistors in the shift register unit is small, and compared with the traditional shift register unit, the pre-charging function may be realized without adding additional signals for controlling the pre-charging function. The circuit structure is simplified, the narrow bezel and the high resolution may be realized, and the cost may be reduced. For example, the shift register unit of at least one embodiment may realize the bidirectional scanning function without adding additional signals for controlling the scanning direction, which is conducive to realizing the arrangement of wires in the narrow bezel.

Hereinafter, embodiments of the present disclosure will be described in detail with reference to the accompanying drawings. It should be noted that the same reference numerals in different drawings will be used to refer to the same elements already described.

At least one embodiment of the present disclosure provides a shift register unit, and the shift register unit includes a first input circuit, an output circuit, and a first output pull-down circuit. The first input circuit is configured to charge a pull-up node in response to a first clock signal and reset the pull-up node in response to the first clock signal; the output circuit is configured to output a second clock signal to an output terminal under the control of the level of the pull-up node; the first output pull-down circuit is configured to denoise the output terminal in response to a third clock signal.

FIG. 1 is a schematic block diagram of a shift register unit provided by an embodiment of the present disclosure. Referring to FIG. 1, the shift register unit 10 includes a first input circuit 100, an output circuit 200, and a first output pull-down circuit 300.

The first input circuit 100 is configured to charge the pull-up node PU in response to the first clock signal and reset the pull-up node PU in response to the first clock signal. For example, the first input circuit 100 is connected to the first clock signal terminal CK1 and the pull-up node PU, and is configured to electrically connect the pull-up node PU and an additionally provided first input terminal under the control of the first clock signal provided by the first clock signal terminal CK1, so that the high-level signal output from the first input terminal may charge the pull-up node PU to increase the voltage of the pull-up node PU, thereby controlling the output circuit 200 to work. In addition, the first input circuit 100 is further configured to reset the pull-up node PU with the low level signal output from the first input terminal under the control of the first clock signal provided by the first clock signal terminal CK1, so that the voltage of the pull-up node PU is lowered to control the output circuit 200 to stop working. For example, the first input terminal is connected to the trigger signal line or the output terminal Output of a previous-stage shift register unit 10 adjacent to the current-stage shift register unit 10 including the first input circuit 100. The first input signal provided by the first input terminal is a trigger signal provided to the shift register unit 10 of the current stage.

In the shift register unit provided by the embodiment of the present disclosure, the first input circuit 100 may not only charge the pull-up node PU, but also reset the pull-up node PU, so that it is not necessary to separately set a reset circuit of the pull-up node PU in the shift register unit 10, and thus the circuit structure is simplified.

The output circuit 200 is configured to output a second clock signal to the output terminal Output of the shift register unit 10 as an output signal of the shift register unit 10 under the control of the level of the pull-up node PU to drive, for example, a gate line connected to the output terminal Output. For example, the output circuit 200 is connected to the second clock signal terminal CK2, the pull-up node PU, and the output terminal Output, and is configured to work under the control of the level of the pull-up node PU to electrically connect the second clock signal terminal CK2 and the output terminal Output, so that the second clock signal input to the second clock signal terminal CK2 may be output to the output terminal Output.

The first output pull-down circuit 300 is configured to denoise the output terminal Output in response to the third clock signal. For example, the first output pull-down circuit 300 is connected to the third clock signal terminal CK3, the output terminal Output, and the first voltage terminal (for example, the first voltage terminal may be a low voltage terminal, so that the first voltage output by the first voltage terminal is a low voltage), and is configured to electrically connect the output terminal Output and the first voltage terminal under the control of the third clock signal provided by the third clock signal terminal CK3, so that the low-level first voltage output by the first voltage terminal may denoise the output terminal Output.

Figure 2:
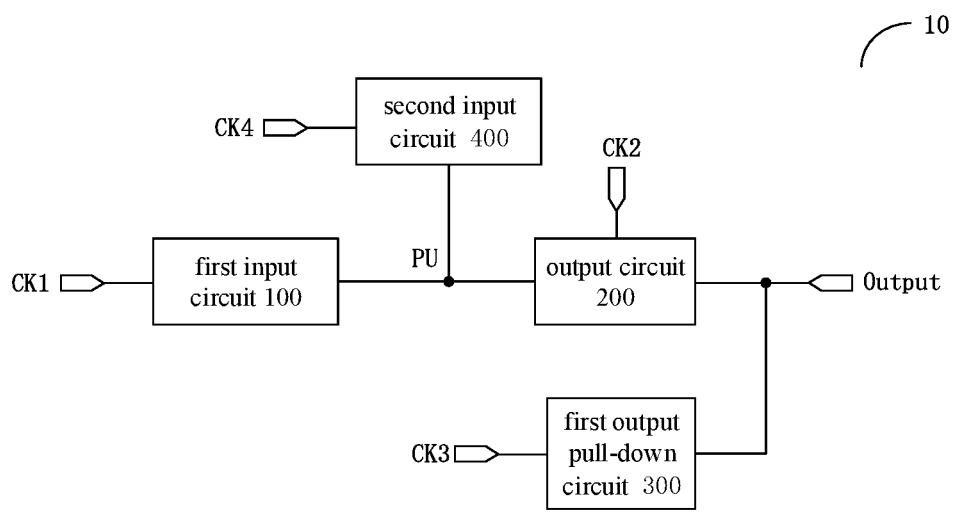
FIG. 2 is a schematic block diagram of another shift register unit provided by an embodiment of the disclosure.

FIG. 2 is a schematic block diagram of another shift register unit provided by an embodiment of the disclosure. Referring to FIG. 2, in this embodiment, the shift register unit 10 further includes a second input circuit 400, and other structures in the shift register unit 10 (e.g., the first input circuit 100, the output circuit 200, and the first output pull-down circuit 300) are substantially the same as the shift register unit 10 shown in FIG. 1.

The second input circuit 400 is configured to denoise the pull-up node PU in response to the fourth clock signal. For example, the second input circuit 400 is connected to the fourth clock signal terminal CK4 and the pull-up node PU, and is configured to electrically connect the pull-up node PU and a second input terminal additionally provided under the control of the fourth clock signal provided by the fourth clock signal terminal CK4, so that the low-level signal output from the second input terminal may denoise the pull-up node PU. For example, the second input terminal is connected to the output terminal Output or the trigger signal line of the next-stage shift register unit 10 adjacent to the current-stage shift register unit 10 including the second input circuit 400. For example, in a stage where the pull-up node PU requires being kept at a low potential, the second input circuit 400 and the first input circuit 100 cooperate with each other to alternately denoise or reset the pull-up node PU, and the time for denoising or resetting the pull-up node PU includes the time when the second clock signal is at a high level, thereby ensuring that the pull-up node PU is kept at a low potential to avoid defects such as spikes and the like generated in the signal of the output terminal Output due to the second clock signal.

For example, the circuit structure of the second input circuit 400 is similar to that of the first input circuit 100 or the second input circuit 400 and the first input circuit 100 are symmetrically arranged, and the shift register unit 10 may be used for bi-directional scanning through the cooperation of clock signals (first clock signal, second clock signal, third clock signal and fourth clock signal) and input signals (e.g., first input signal and second input signal), thereby reducing control signals and facilitating achieving narrow bezels and the high resolution. In a case where the display panel of the shift register unit 10 is used for forward scanning, the trigger signal or the signal provided by the shift register unit 10 of the previous stage is input from the first input terminal, and the operation is as described above. In another example, in a case where the display panel of the shift register unit 10 is used for reverse scanning, the trigger signal or the signal provided by the shift register unit 10 of the next stage is input by the second input terminal instead. At this time, the second input circuit 400 is configured to charge the pull-up node PU in response to the fourth clock signal and reset the pull-up node PU in response to the fourth clock signal; while the first input circuit 100 is configured to denoise the pull-up node PU in response to the first clock signal. The circuit may realize the bidirectional scanning function without additional signals (for example, scanning direction control signals), thereby simplifying the circuit structure and the scanning control mode.

It should be noted that in various embodiments of the present disclosure, the directions of the forward scanning and the reverse scanning are relative directions, and the scanning along the first direction of the bidirectional scanning may be referred to as the forward scanning, and the scanning along the second direction opposite to the first direction may be referred to as the reverse scanning. For example, if the first direction indicates the direction from the first row of gate lines of the display panel to the last row of gate lines of the display panel, the second direction may indicate the direction from the last row of gate lines of the display panel to the first row of gate lines of the display panel.

Figure 3:
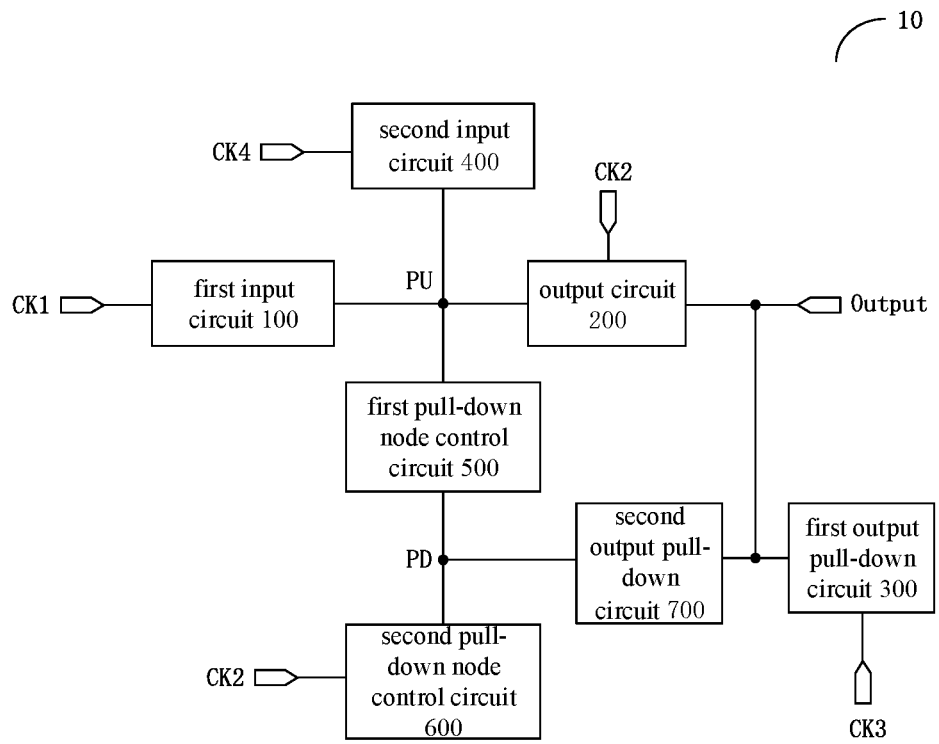
FIG. 3 is a schematic block diagram of yet another shift register unit provided by an embodiment of the disclosure.

FIG. 3 is a schematic block diagram of another shift register unit provided by an embodiment of the disclosure. Referring to FIG. 3, the shift register unit 10 of this embodiment further includes a first pull-down node control circuit 500, a second pull-down node control circuit 600, and a second output pull-down circuit 700. Other structures of the shift register unit 10 (e.g., the first input circuit 100, the output circuit 200, the first output pull-down circuit 300, and the second input circuit 400) are substantially the same as those of the shift register unit 10 shown in FIG. 2.

The first pull-down node control circuit 500 is configured to control the level of the pull-down node PD under the control of the level of the pull-up node PU. For example, the first pull-down node control circuit 500 is connected to the pull-up node PU and the pull-down node PD, and is configured to electrically connect the pull-down node PD with an additionally provided low voltage terminal (e.g., the first voltage terminal) under the control of the level of the pull-up node PU, so that the low level signal output from the low voltage terminal may control the level of the pull-down node PD, e.g., make the level of the pull-down node PD be low.

The second pull-down node control circuit 600 is configured to control the level of the pull-down node PD in response to the second clock signal. For example, the second pull-down node control circuit 600 is connected to the second clock signal terminal CK2 and the pull-down node PD, and is configured to make the level of the pull-down node PD change with the level of the second clock signal under the control of the second clock signal provided by the second clock signal terminal CK2, for example, to make the level of the pull-down node PD be a high level and a low level alternately.

The second output pull-down circuit 700 is configured to denoise the output terminal Output under the control of the level of the pull-down node PD. For example, the second output pull-down circuit 700 is connected to the pull-down node PD and the output terminal Output, and is configured to electrically connect the output terminal Output and an additionally provided low voltage terminal (e.g., the first voltage terminal) under the control of the level of the pull-down node PD, so that the low level signal output from the low voltage terminal may reduce noise at the output terminal Output. For example, the second output pull-down circuit 700 and the first output pull-down circuit 300 cooperate with each other to alternately reduce noise at the output terminal Output, for example, to realize double pull-down of the output terminal Output, so that the operating duty ratio of transistors used for the pull-down operation is less than 50%, improving the reliability of the circuit and the display panel using the circuit.

Figure 4:
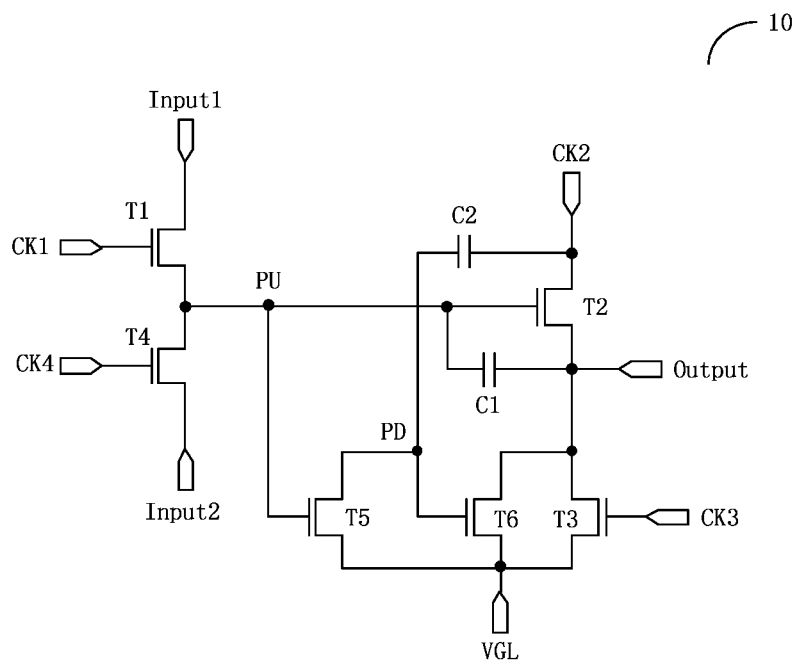
FIG. 4 is a circuit diagram of a particular implementation example of the shift register unit shown in FIG. 3.

FIG. 4 is a circuit diagram of a particular implementation example of the shift register unit shown in FIG. 3. In the following description, each transistor is illustrated as an N-type transistor, but the embodiments of the present disclosure are not limited thereto. Meanwhile, in the following description of the embodiments of the present disclosure, each transistor (e.g., first to sixth transistors T1-T6 described below) is an N-type transistor as an example, so "effective level" indicates a high level. However, the present disclosure is not limited thereto, and when each transistor (e.g., first to sixth transistors T1-T6 described below) is a P-type transistor, "effective level" indicates a low level.

Referring to FIG. 4, the shift register unit 10 includes first to sixth transistors T1-T6, a first capacitor C1, and a second capacitor C2.

The first input circuit 100 may be implemented as a first transistor T1. The gate of the first transistor T1 is configured to be connected to the first clock signal terminal CK1 to receive the first clock signal, the first electrode of the first transistor T1 is configured to be connected to the first input terminal Input1 to receive the first input signal, and the second electrode of the first transistor T1 is configured to be connected to the pull-up node PU. The first transistor T1 is turned on when the first clock signal is at an effective level (e.g., high level), and the first input terminal Input1 and the pull-up node PU are electrically connected, so that the pull-up node PU may be charged or reset. For example, in a case where the first transistor T1 is turned on, the pull-up node PU may be charged when the first input signal is at a high level, while the pull-up node PU may be reset when the first input signal is at a low level. For example, in another example, when the display panel of the shift register unit 10 is used for reverse scanning, the first transistor T1 is turned on when the first clock signal is at an effective level, so that the first input signal of the first input terminal Input1 denoises the pull-up node PU.

The output circuit 200 may be implemented as a second transistor T2 and a first capacitor C1. The gate of the second transistor T2 is configured to be connected to the pull-up node PU, the first electrode of the second transistor T2 is configured to be connected to the second clock signal terminal CK2 to receive the second clock signal, and the second electrode of the second transistor T2 is configured to be connected to the output terminal Output. The first electrode of the first capacitor C1 is configured to be connected to the gate of the second transistor T2, and the second electrode of the first capacitor C1 is configured to be connected to the second electrode of the second transistor T2. When the pull-up node PU is at an effective level (e.g., high level), the second transistor T2 is turned on, thereby outputting the second clock signal to the output terminal Output.

It should be noted that the first capacitor C1 may be a capacitor device fabricated on the display panel through a process, for example, a special capacitor electrode may be fabricated to realize the capacitor device, the capacitor electrode may be fabricated through a metal layer, a semiconductor layer (e.g., doped polysilicon), etc., and the first capacitor C1 may also be a parasitic capacitor between transistors, and may be fabricated through the transistors themselves and other devices and wires. For example, in an example, the first capacitor C1 is a parasitic capacitor, so the output circuit 200 includes only the second transistor T2 without a specially fabricated capacitor device. This may simplify the process, reduce the production costs and improve the production efficiency.

The first output pull-down circuit 300 may be implemented as a third transistor T3. The gate of the third transistor T3 is configured to be connected to the third clock signal terminal CK3 to receive the third clock signal, the first electrode of the third transistor T3 is configured to be connected to the output terminal Output, and the second electrode of the third transistor T3 is configured to be connected to the first voltage terminal VGL to receive the first voltage. For example, the first voltage terminal VGL is configured to provide a DC (direct current) low-level signal (e.g., lower than or equal to the low-level portion of the clock signal), such as being grounded. The DC low-level signal is referred to as the first voltage, and the following embodiments are the same as the above in this aspect and will not be described again. When the third clock signal is at an effective level, the third transistor T3 is turned on to electrically connect the output terminal Output and the first voltage terminal VGL, thereby reducing the noise of the output terminal Output to make the output terminal Output be at a low level.

The second input circuit 400 may be implemented as a fourth transistor T4. The gate of the fourth transistor T4 is configured to be connected to the fourth clock signal terminal CK4 to receive the fourth clock signal, the first electrode of the fourth transistor T4 is configured to be connected to the pull-up node PU, and the second electrode of the fourth transistor T4 is configured to be connected to the second input terminal Input2 to receive the second input signal. The fourth transistor T4 is turned on when the fourth clock signal is at an effective level (e.g., high level), and the second input terminal Input2 and the pull-up node PU are electrically connected, thereby noise reduction may be performed on the pull-up node PU. For example, in another example, when the display panel of the shift register unit 10 is used for reverse scanning, the fourth transistor T4 is turned on when the fourth clock signal is at an effective level, so that the pull-up node PU is charged with the high-level second input signal output from the second input terminal Input2, and in addition, the pull-up node PU may be reset with the low-level second input signal output from the second input terminal Input2.

The first pull-down node control circuit 500 may be implemented as a fifth transistor T5. The gate of the fifth transistor T5 is configured to be connected to the pull-up node PU, the first electrode of the fifth transistor T5 is configured to be connected to the pull-down node PD, and the second electrode of the fifth transistor T5 is configured to be connected to the first voltage terminal VGL to receive the first voltage. When the pull-up node PU is at an effective level, the fifth transistor T5 is turned on to electrically connect the pull-down node PD with the first voltage terminal VGL, thereby pulling down the level of the pull-down node PD to a low level.

The second pull-down node control circuit 600 may be implemented as a second capacitor C2. The first electrode of the second capacitor C2 is configured to be connected to the pull-down node PD, and the second electrode of the second capacitor C2 is configured to be connected to the second clock signal terminal CK2 to receive the second clock signal. When the fifth transistor T5 is turned off, the pull-down node PD is in a floating state. Due to the bootstrap effect of the second capacitor C2, the level of the pull-down node PD changes with the level of the second clock signal. For example, when the level of the second clock signal changes alternately between a high level and a low level, the level of the pull-down node PD changes alternately into a high level and a low level, and the sixth transistor T6 described later is controlled to be turned on and off accordingly.

The second output pull-down circuit 700 may be implemented as a sixth transistor T6. The gate of the sixth transistor T6 is configured to be connected to the pull-down node PD, the first electrode of the sixth transistor T6 is configured to be connected to the output terminal Output, and the second electrode of the sixth transistor T6 is configured to be connected to the first voltage terminal VGL to receive the first voltage. When the level of the pull-down node PD is an effective level (e.g., a high level), the sixth transistor T6 is turned on to electrically connect the output terminal Output and the first voltage terminal VGL, thereby reducing the noise of the output terminal Output and making the output terminal Output be at a low level. For example, the level of the pull-down node PD and the level of the third clock signal may be an effective level alternately, so that the sixth transistor T6 and the third transistor T3 are alternately turned on to realize double pull-down of the output terminal Output and ensure that the output terminal Output is at a low level. In addition, the sixth transistor T6 and the third transistor T3 are used for about 50% the scanning process of a whole frame, which may slow down the performance degradation of the device and prevent the threshold voltage from shifting.

It should be noted that in the description of various embodiments of the present disclosure, the pull-up node PU and the pull-down node PD do not represent actual components, but rather represent the junction points of related electrical connections in the circuit diagram.

It should be noted that the transistors used in the embodiments of the present disclosure may be thin film transistors, field effect transistors or other switching devices with the same characteristics, and the embodiments of the present disclosure are all described as thin film transistors as an example. The source and drain of the transistor used here may be symmetrical in structure, so the source and drain may be structurally indistinguishable. In the embodiment of the present disclosure, in order to distinguish the two electrodes of the transistor except the gate, one electrode is directly described as the first electrode and the other electrode is described as the second electrode.

In addition, the transistors in the embodiments of the present disclosure are all described as N-type transistors as an example, and in this case, the first electrode of the transistor is a drain electrode and the second electrode is a source electrode. It should be noted that this disclosure includes but is not limited to this. For example, one or more transistors in the shift register unit 10 provided by the embodiment of the present disclosure may also adopt P-type transistors, and in this case, the first electrode of the transistor is a source electrode and the second electrode is a drain electrode. For example, in other embodiments, when each transistor (e.g., first to sixth transistors T1-T6 described below) is a P-type transistor, each electrode of each transistor of the selected type is correspondingly connected to other elements with reference to each electrode of a corresponding transistor in the embodiment of the present disclosure, and the first voltage terminal VGL is configured to provide a DC high level signal (e.g., higher than or equal to a high level portion of a clock signal). When an N-type transistor is used, indium gallium zinc oxide (IGZO) may be used as the active layer of the thin film transistor. Compared with using low temperature poly silicon (LTPS) or amorphous silicon (such as hydrogenated amorphous silicon) as the active layer of the thin film transistor, the size of the transistor may be effectively reduced and leakage current may be prevented.

Figure 5:
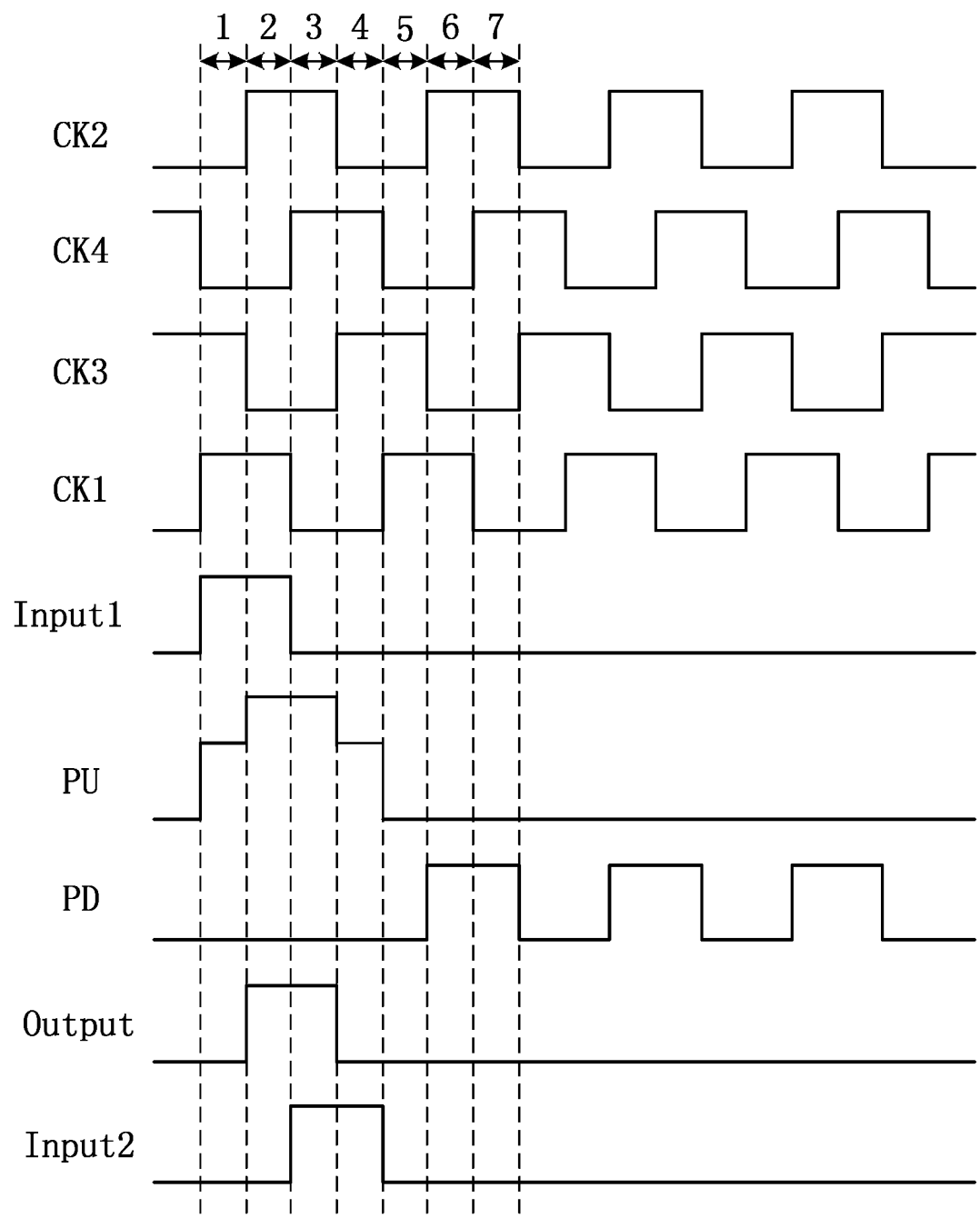
FIG. 5 is a signal timing diagram of a shift register unit provided by an embodiment of the present disclosure.

FIG. 5 is a signal timing diagram of a shift register unit provided by an embodiment of the present disclosure. The operation principle of the shift register unit 10 shown in FIG. 4 will be described below with reference to the signal timing diagram shown in FIG. 5, and each transistor is an n-type transistor as an example, but the embodiment of the present disclosure is not limited thereto. In the figure and the following description, CK1, CK2, CK3, CK4, STV, Input1, Input2, etc. are used to represent not only the corresponding signal terminals, but also the first clock signal, the second clock signal, the third clock signal, the fourth clock signal, the trigger signal, etc., respectively.

In the seven phases, i.e., the first phase 1, the second phase 2, the third phase 3, the fourth phase 4, the fifth phase 5, the sixth phase 6, and the seventh phase 7, shown in FIG. 5, the shift register unit 10 may respectively perform the following operations.

In the first phase 1, the level of the first clock signal CK1 and the level of the third clock signal CK3 are high, and the level of the second clock signal CK2 and the level of the fourth clock signal CK4 are low. The first input terminal Input1 provides a high-level first input signal Input1. The first transistor T1 is turned on by the high level of the first clock signal CK1, and the first input signal Input1 starts to charge the pull-up node PU, thereby increasing the potential of the pull-up node PU. Finally the pull-up node PU is charged to the first level, and the first level is high. Since the level of the pull-up node PU is at a high level, the fifth transistor T5 is turned on, so that the pull-down node PD is connected to the first power supply terminal VGL, and thus the pull-down node PD is at a low level. The second transistor T2 is also turned on to output the second clock signal CK2 to the output terminal Output. The third transistor T3 is turned on by the high level of the third clock signal CK3 and outputs a first voltage (provided by the first voltage terminal VGL) to the output terminal Output. Since the level of the second clock signal CK2 and the electrical average of the first voltage are low in the first phase 1, the level of the output terminal Output is also low. Since the level of the fourth clock signal CK4 is low, the fourth transistor T4 is turned off. The sixth transistor T6 is turned off by the low level of the pull-down node PD.

In the second phase 2, the level of the first clock signal CK1 is maintained at a high level, the level of the second clock signal CK2 is changed to a high level, the level of the third clock signal CK3 is changed to a low level, and the level of the fourth clock signal CK4 is maintained at a low level. The second transistor T2 remains turned on and outputs the high level of the second clock signal CK2 to the output terminal Output. Since the level of the second clock signal CK2 becomes a high level, the level of the output terminal Output becomes a high level. Due to the bootstrap effect of the first capacitor C1, in order to keep the voltage difference between the two electrodes of the first capacitor C1 unchanged, the potential of the pull-up node PU is further pulled up. For example, at this time, the level of the pull-up node PU is the second level, the second level is also a high level, and the second level is higher than the first level. As a result, the second transistor T2 is fully turned on. Since the level of the pull-up node PU is further pulled up to the second level, the level of the pull-up node PU is higher than that of the gate of the first transistor T1 (i.e., the level of the first clock signal CK1), the first transistor T1 is saturated and turned off. The fifth transistor T5 is kept turned on by the high level of the pull-up node PU, so that the pull-down node PD is still at the low level. Since the level of the third clock signal CK3 becomes a low level, the third transistor T3 is turned off. At this time, both the fourth transistor T4 and the sixth transistor T6 are turned off.

In the third phase 3, the level of the first clock signal CK1 becomes low, the level of the second clock signal CK2 remains high, the level of the third clock signal CK3 remains low, and the level of the fourth clock signal CK4 becomes high. At this time, the first transistor T1 is turned off. The pull-up node PU maintains the level of the previous phase (i.e., the second level), the second transistor T2 remains turned on, and the high level of the second clock signal CK2 continues to be output to the output terminal Output. The fifth transistor T5 is kept turned on by the high level of the pull-up node PU, so that the level of the pull-down node PD remains low. The sixth transistor T6 remains turned off. Since the level of the third clock signal CK3 remains low, the third transistor T3 remains turned off. Although the level of the fourth clock signal CK4 changes to a high level and the second input signal terminal Input2 provides a high level signal, the level of the pull-up node PU at this time is the second level, which is higher than the level of the gate of the fourth transistor T4 (i.e., the level of the fourth clock signal CK4), so the fourth transistor T4 is saturated and turned off.

In the fourth phase 4, the level of the first clock signal CK1 is maintained at a low level, the level of the second clock signal CK2 is changed to a low level, the level of the third clock signal CK3 is changed to a high level, and the level of the fourth clock signal CK4 is maintained at a high level. At this time, the second transistor T2 is kept turned on, and the output terminal Output is pulled down through the second transistor T2, so that the level of the output terminal Output is at a low level. Due to the bootstrap effect of the first capacitor C1, in order to keep the voltage difference between the two electrodes of the first capacitor C1 unchanged, the level of the pull-up node PU becomes the first level. In addition, since the level of the fourth clock signal CK4 is kept at a high level, the level of the second input signal Input2 is high. When the level of the pull-up node PU changes to the first level, the fourth transistor T4 is turned on. The second input signal Input2 may be charged in the pull-up stage PU to maintain the pull-up node PU at the first level. At this time, the pull-up node PU may still turn on the second transistor T2. That is, in the present disclosure, the second transistor T2 may pull up the output terminal Output or pull down the output terminal Output. For example, the second transistor T2 is a thin film transistor with a larger size, so the pull-down time is short. Since the level of the third clock signal CK3 becomes a high level, the third transistor T3 is turned on. The third transistor T3 also pulls down the output terminal Output to maintain the output low level, so that the accuracy of the output signal is high. Since the second transistor T2 may rapidly pull down the potential of the output terminal Output, the third transistor T3 and the sixth transistor T6 with the smallest size for pulling down the potential of the output terminal Output may be adopted or the sizes of the third transistor T3 and the sixth transistor T6 may be reduced, which is favorable for narrow bezels and high resolution. The fifth transistor T5 remains turned on, so that the level of the pull-down node PD remains low. The first transistor T1 and the sixth transistor T6 remain turned off.

In the fifth phase 5, the level of the first clock signal CK1 becomes high, and the level of the second clock signal CK2 remains low. At this time, the first transistor T1 is turned on, and the first input terminal Input1 provides a low level signal, thereby resetting the pull-up node PU and changing the level of the pull-up node PU to a low level. The second transistor T2 and the fifth transistor T5 are turned off by the low level of the pull-up node PU. Since the level of the third clock signal CK3 is high, the third transistor T3 remains turned on, and the output terminal Output is denoised with the first voltage at the first voltage terminal. The level of the fourth clock signal CK4 becomes a low level, and the fourth transistor T4 is turned off. The pull-down node PD maintains the level of the previous phase (i.e., the fourth phase 4) (i.e., the low level), and the sixth transistor T6 remains turned off.

In the sixth phase 6, the level of the first clock signal CK1 is kept at a high level, the first transistor T1 is kept turned on, and the level of the pull-up node PU is kept at a low level, so as to reduce the influence of the high level of the second clock signal CK2 on the pull-up node PU through the parasitic capacitance, thereby avoiding the generation of spikes and other defects in the signal of the output terminal Output. The level of the third clock signal CK3 becomes a low level, and the third transistor T3 is turned off. The fourth clock signal CK4 remains at a low level, and the fourth transistor T4 is turned off. Since the level of the pull-up node PU is low, the second transistor T2 and the fifth transistor T5 remain turned off. The level of the second clock signal CK2 changes to a high level, and due to the bootstrap effect of the second capacitor C2, the level of the pull-down node PD also changes to a high level, thereby turning on the sixth transistor T6 and reducing noises at the output terminal Output by the first voltage at the first voltage terminal.

In the seventh phase 7, the level of the fourth clock signal CK4 changes to a high level, the fourth transistor T4 is turned on, and the second input terminal Input2 provides a low level signal to maintain the low level of the pull-up node PU, so that the influence of the high level of the second clock signal CK2 on the pull-up node PU through the parasitic capacitance is reduced, and defects such as spikes and the like generated in the signal of the output terminal Output are avoided. The level of the first clock signal CK1 becomes a low level, and the first transistor T1 is turned off. The third clock signal CK3 is kept at a low level, and the third transistor T3 is turned off. Since the level of the pull-up node PU is low, the second transistor T2 and the fifth transistor T5 remain turned off. The level of the second clock signal CK2 is kept at a high level, and the sixth transistor T6 is kept turned on to reduce noises at the output terminal Output by the first voltage at the first voltage terminal.

In a subsequent phase after the seventh phase 7, the level of the pull-down node PD changes with the level of the second clock signal CK2, and the third clock signal CK3 and the pull-down node PD have opposite phases, so that the sixth transistor T6 and the third transistor T3 are alternately turned on to continuously reduce noises at the output terminal Output and maintain the low level of the output terminal Output. This double pull-down mode may improve the reliability of the circuit and the display panel using the circuit. In addition, the sixth transistor T6 and the third transistor T3 are used for about 50% the scanning process of a whole frame, which may slow down the performance degradation of the device and prevent the threshold voltage from shifting. In the fourth phase 4, when the level of the second clock signal CK2 changes to a low level, the output terminal Output is pulled down through the second transistor T2, and the sixth transistor T6 and the third transistor T3 only play a role of maintaining the level. Therefore, the sizes of the sixth transistor T6 and the third transistor T3 may be appropriately reduced, which may not only reduce power consumption, but also reduce the occupied space of the circuit, and is favorable for realizing narrow bezels and high resolution.

In a subsequent phase after the seventh phase 7, since the first clock signal CK1 and the fourth clock signal CK4 are have opposite phases, the first transistor T1 and the fourth transistor T4 are alternately turned on to reduce noises at the pull-up node PU and maintain the low level of the pull-up node PU. In this way, the influence of the high level of the second clock signal CK2 on the pull-up node PU through the parasitic capacitance may be reduced, and defects such as spikes and the like generated in the signal of the output terminal Output may be avoided. In addition, the first transistor T1 and the fourth transistor T4 are used for about 50% the scanning process of a whole frame, which may slow down the performance degradation of the device and prevent the threshold voltage from shifting.

For example, when the shift register unit 10 performs forward scanning, the operation principle of the shift register unit 10 is as described above for the first phase 1 to the seventh phase 7. The first clock signal CK1, the second clock signal CK2, the third clock signal CK3, and the fourth clock signal CK4 have the same period. Furthermore, as shown in FIG. 5, the phase of the second clock signal CK2 is one quarter of the period later than the phase of the first clock signal CK1, the phase of the fourth clock signal CK4 is one quarter of the period later than the phase of the second clock signal CK2, and the phase of the third clock signal CK3 is one quarter of the period later than the phase of the fourth clock signal CK4. The first clock signal CK1 and the fourth clock signal CK4 have opposite phases, and the second clock signal CK2 and the third clock signal CK3 have opposite phases.

For example, during the forward scanning, the signals of the first input terminal Input1, the output terminal Output and the second input terminal Input2 are the output signals of three adjacent cascaded shift register units 10, and the output signals of any two adjacent shift register units 10 partially overlap with each other for half of the high-level pulse width of the clock signal to realize the pre-charging function. Compared with the traditional circuit with the pre-charging function, the shift register unit 10 does not require additional signals, and the connection relation among the plurality of shift register units 10 is simple, which is favorable for realizing narrow bezels and high resolution.

Figure 6:
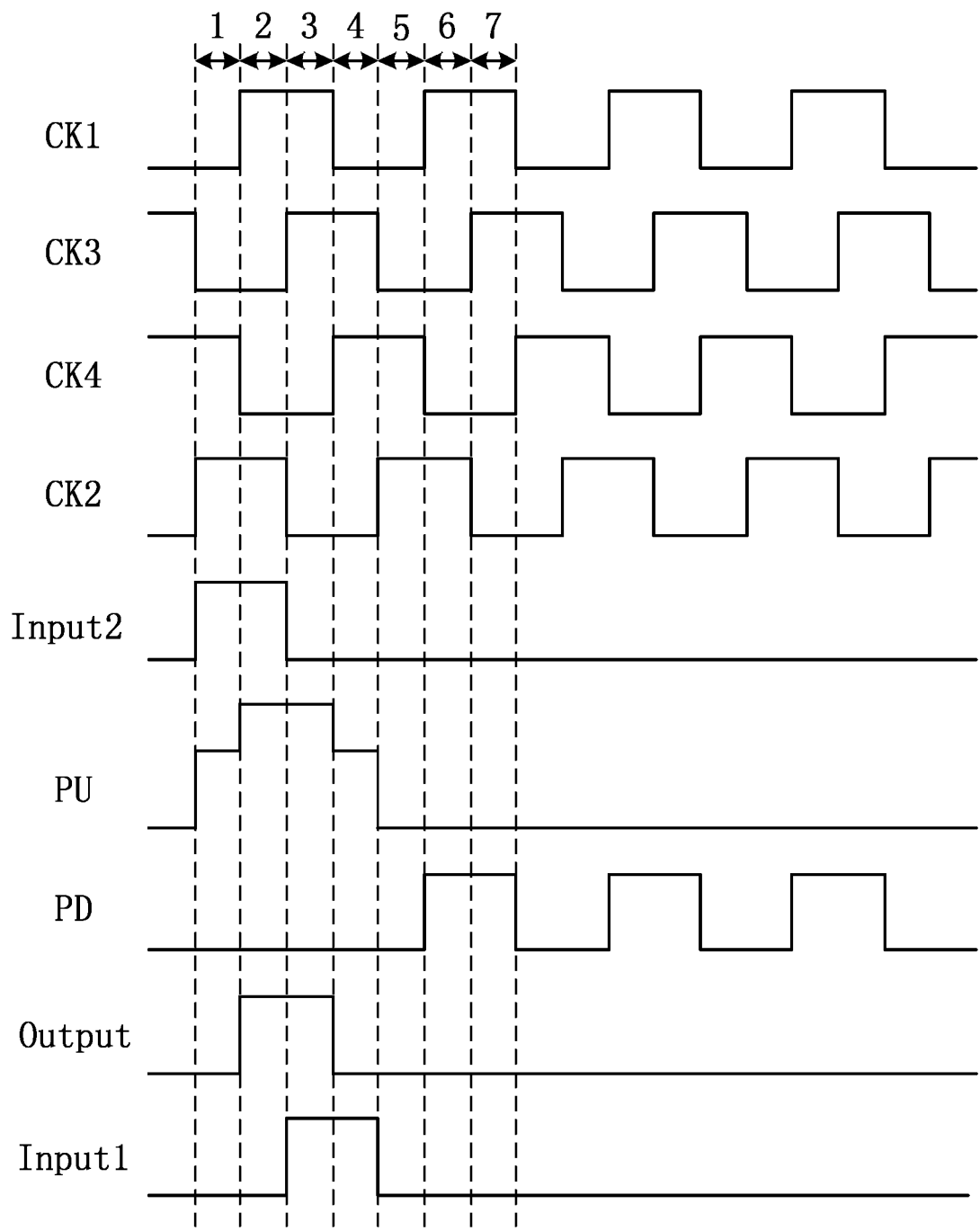
FIG. 6 is a signal timing diagram of another shift register unit provided by an embodiment of the present disclosure.

For example, when the shift register unit 10 performs reverse scanning, the signal timing diagram thereof is shown in FIG. 6, and the working principle thereof is similar to that of the forward scanning. The trigger signal provided to the shift register unit 10 of this stage may be input by the second input terminal Input2, which will not be repeated here.

It should be noted that the phase relationship between the first clock signal CK1, the second clock signal CK2, the third clock signal CK3, and the fourth clock signal CK4 is different from the phase relationship between them during the forward scanning. As shown in FIG. 6, the first clock signal CK1, the second clock signal CK2, the third clock signal CK3, and the fourth clock signal CK4 have the same period. The phase of the first clock signal CK1 is one quarter of the period later than the phase of the second clock signal CK2, the phase of the third clock signal CK3 is one quarter of the period later than the phase of the first clock signal CK1, and the phase of the fourth clock signal CK4 is one quarter of the period later than the phase of the third clock signal CK3. The first clock signal CK1 and the fourth clock signal CK4 have opposite phases, and the second clock signal CK2 and the third clock signal CK3 have opposite phases.

The shift register unit 10 may realize a bidirectional scanning function without additional signals (e.g., scanning direction control signals) by matching the timing of the four clock signals and the trigger signals supplied to the shift register unit 10 of the stage, thus simplifying the circuit structure and the scanning control mode. For example, the above four clock signals may be generated by the timing controller T-CON, which is easy to implement.

At least one embodiment of the present disclosure further provides a gate drive circuit. The gate drive circuit includes the shift register unit provided by any embodiment of the present disclosure. The number of transistors in the gate drive circuit is small, the pre-charging function may be realized without additionally adding signals for controlling the pre-charging function, the circuit structure is simple, the narrow bezel and high resolution may be realized, and the costs may be reduced. For example, the gate drive circuit of at least one embodiment may realize the bidirectional scanning function without additionally adding signals for controlling the scanning direction, which is conducive to realizing the arrangement of wires in the narrow bezel.

Figure 7:
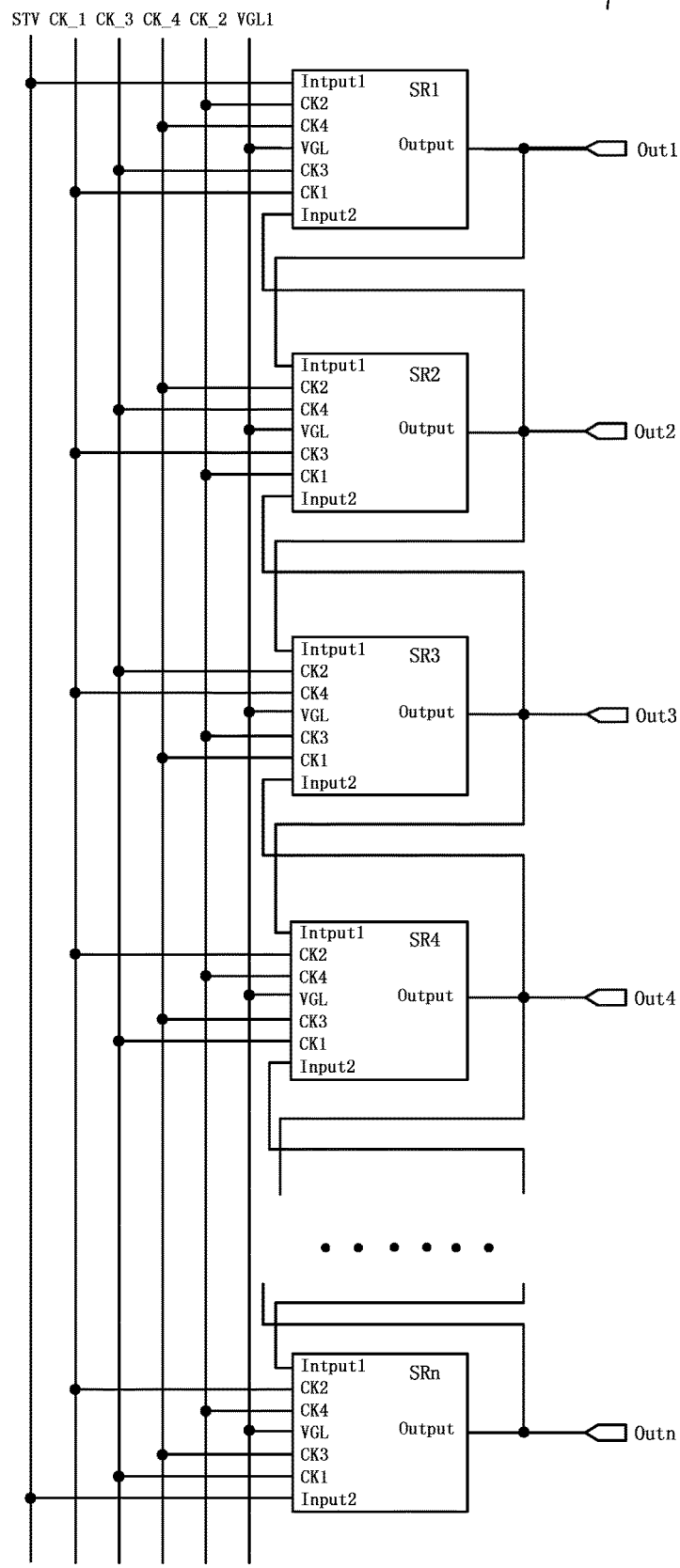
FIG. 7 is a schematic block diagram of a gate drive circuit provided by an embodiment of the present disclosure.

FIG. 7 is a schematic block diagram of a gate drive circuit provided by an embodiment of the present disclosure. Referring to FIG. 7, the gate drive circuit 20 includes a plurality of cascaded shift register units (SR1, SR2, SR3, SR4 . . . SRn). The number of the shift register units is not limited and may be determined according to actual requirements.

For example, for a display device with a resolution of 640×480, the number of shift register units may be 480, and correspondingly, for a display device with a resolution of 1920×1440, the number of the shift register units may be 1440. For example, the shift register unit uses the shift register unit 10 described in any embodiment of the present disclosure. For example, in the gate drive circuit 20, some or all of the shift register units may adopt the shift register unit 10 described in any embodiment of the present disclosure. For example, the gate drive circuit 20 may be directly integrated on the array substrate of the display device using the same process as that of the thin film transistor to realize the progressive scan drive function.

For example, each shift register unit has a first input terminal Input1, a second input terminal Input2, first to fourth clock signal terminals CK1-CK4, a first voltage terminal VGL, and an output terminal Output. For example, except for the first stage, the output terminal Output of each stage shift register unit is connected to the second input terminal Input2 of the adjacent upper stage shift register unit. For example, except for the last stage, the output terminal Output of each stage shift register unit is connected to the first input terminal Input1 of the adjacent next-stage shift register unit. For example, when the gate drive circuit realizes forward scanning, the first input terminal Input1 of the first stage shift register unit is configured to be connected to the trigger signal line STV to receive the trigger signal STV; the second input terminal Input2 of the shift register unit of the last stage is configured to be connected to the trigger signal line STV to receive a corresponding signal, such as the trigger signal STV, and when the trigger signal STV is at an effective level, the first clock signal CK1 is also at an effective level. When the gate drive circuit realizes reverse scanning, a trigger signal STV is provided to the second input terminal Input2 of the last-stage shift register unit, a corresponding signal, such as the trigger signal STV, is provided to the first input terminal Input1 of the first-stage shift register unit, and when the trigger signal STV is at an effective level, the second clock signal CK2 is also at an effective level.

For example, the gate drive circuit 20 further includes a first clock signal line CK_1, a second clock signal line CK_2, a third clock signal line CK_3, and a fourth clock signal line CK_4. For example, in the gate drive circuit 20, every 4 shift register units form a cascade repetitive unit, and the particular connection mode is as follows, and the cascade mode of other shift register units is similar.

The first clock signal terminal CK1 of the (4n-3)th stage shift register unit (for example, the first stage shift register unit SR1) is connected to the first clock signal line CK_1, the second clock signal terminal CK2 of the (4n-3)th stage shift register unit is connected to the second clock signal line CK_2, the third clock signal terminal CK3 of the (4n-3)th stage shift register unit is connected to the third clock signal line CK_3, and the fourth clock signal terminal CK4 of the (4n-3)th stage shift register unit is connected to the fourth clock signal line CK_4.

The first clock signal terminal CK1 of the (4n-2)th stage shift register unit (for example, the second stage shift register unit SR2) is connected to the second clock signal line CK_2, the second clock signal terminal CK2 of the (4n-2)th stage shift register unit is connected to the fourth clock signal line CK_4, the third clock signal terminal CK3 of the (4n-2)th stage shift register unit is connected with the first clock signal line CK_1, and the fourth clock signal terminal CK4 of the (4n-2)th stage shift register unit is connected to the third clock signal line CK_3.

The first clock signal terminal CK1 of the (4n-1)th stage shift register unit (for example, the third stage shift register unit SR3) is connected to the fourth clock signal line CK_4, the second clock signal terminal CK2 of the (4n-1)th stage shift register unit is connected to the third clock signal line CK_3, the third clock signal terminal CK3 of the (4n-1)th stage shift register unit is connected to the second clock signal line CK_2, and the fourth clock signal terminal CK4 of the (4n-1)th stage shift register unit is connected to the first clock signal line CK_1.

The first clock signal terminal CK1 of the (4n)th stage shift register unit (for example, the fourth stage shift register unit SR4) is connected to the third clock signal line CK_3, the second clock signal terminal CK2 of the (4n)th stage shift register unit is connected with the first clock signal line CK_1, the third clock signal terminal CK3 of the (4n)th stage shift register unit is connected with the fourth clock signal line CK_4, and the fourth clock signal terminal CK4 of the (4n)th stage shift register unit is connected with the second clock signal line CK_2.

Here, n is an integer greater than 0.

During the forward scanning and the reverse scanning, the phase relationship between the signals provided by the first clock signal line CK_1, the second clock signal line CK_2, the third clock signal line CK_3, and the fourth clock signal line CK_4 is different from each other. For details, please refer to the description of the operation principle of the shift register unit 10, which will not be repeated here.

For example, the gate drive circuit 20 may further include a timing controller T-CON configured to provide a first clock signal, a second clock signal, a third clock signal, and a fourth clock signal to the shift register unit of each stage, and the timing controller T-CON may also be configured to provide a trigger signal. It should be noted that the phase relationship between the numerous clock signals provided by the timing controller T-CON is different in the forward scanning and the reverse scanning. In different examples, according to different configurations, more clock signals may be provided, such as 6 clock signals, 8 clock signals, etc. The present disclosure is not limited thereto.

For example, the gate drive circuit 20 further includes a first voltage line VGL1 to provide a first voltage to each shift register unit.

For example, when the gate drive circuit 20 is used to drive a display panel, the gate drive circuit 20 may be disposed on a side of the display panel. For example, the display panel includes a plurality of rows of gate lines, and the output terminals Output of the shift register units of individual stage in the gate drive circuit 20 may be configured to be sequentially connected to the plurality of rows of gate lines for outputting gate scanning signals to each row of gate lines. Certainly, the gate drive circuits 20 may also be provided on both sides of the display panel to realize double-sided driving, and the embodiment of the present disclosure does not limit the arrangement of the gate drive circuits 20. For example, a gate drive circuit 20 may be provided on a side of the display panel for driving the gate lines of odd-numbered rows, while another gate drive circuit 20 may be provided on another side of the display panel for driving the gate lines of even-numbered rows.

Figure 8:
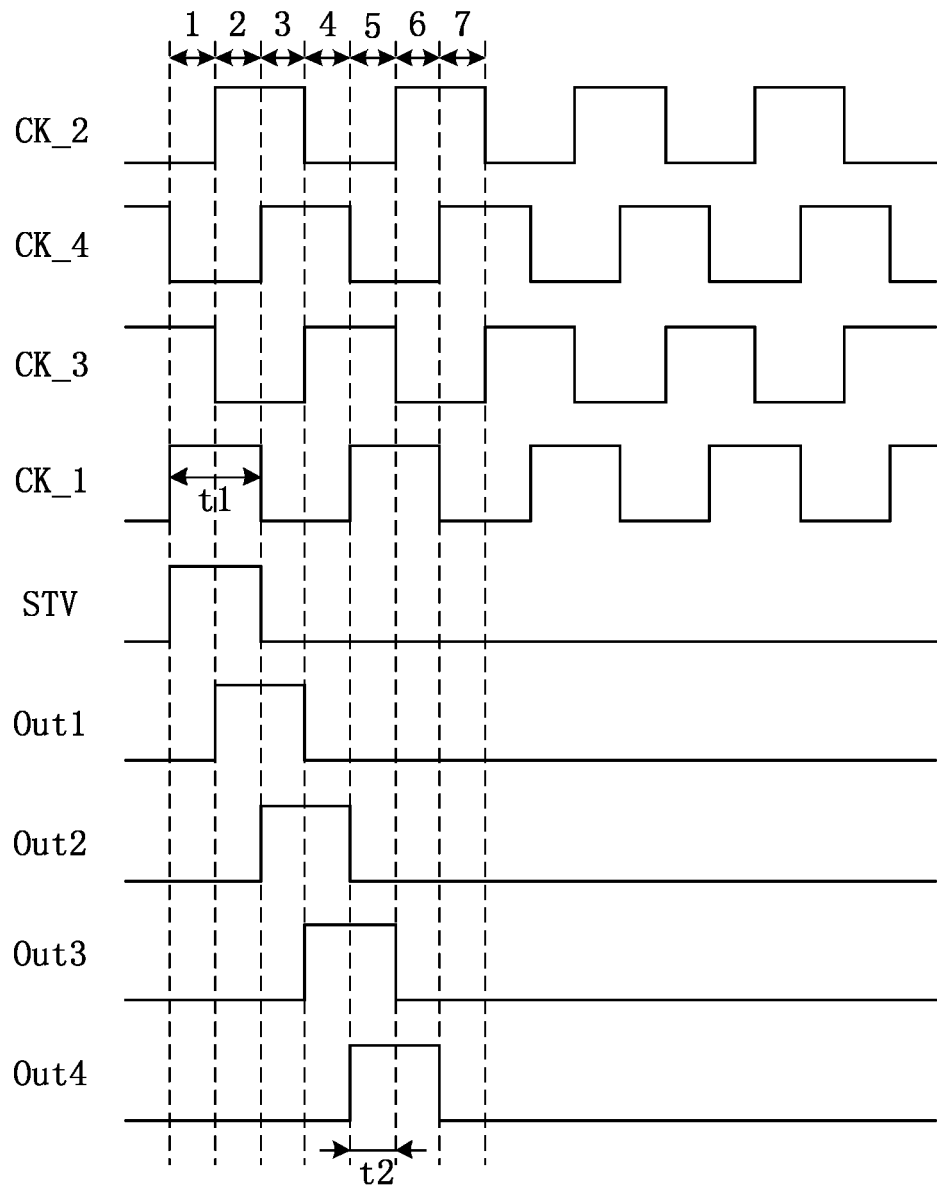
FIG. 8 is a signal timing diagram of a gate drive circuit provided by an embodiment of the present disclosure.

FIG. 8 is a signal timing diagram of a gate drive circuit provided by an embodiment of the present disclosure. Referring to FIG. 8, high-level pulse widths of clock signals provided by the first clock signal line CK_1, the second clock signal line CK_2, the third clock signal line CK_3, and the fourth clock signal line CK_4 are all t1. The output signals of any two adjacent shift register units are partially overlapped with each other for t2. For example, in this example, the gate drive circuit 20 is disposed a one side of the display panel to perform single-sided driving, and the pre-charging time (overlap time) is t2=t1*1/2. For example, in other examples, two gate drive circuits 20 are respectively disposed on two sides of the display panel to perform bilateral driving, then the pre-charging time (overlap time) is t2=t1*3/4 to further extend the pre-charging time. The gate drive circuit 20 may realize the pre-charging function without adding additional signals for controlling the pre-charging function, and the connection relation among a plurality of shift register units is simple, which is favorable for realizing narrow bezels and high resolution.

At least one embodiment of the present disclosure further provides a display device. The display device includes the gate drive circuit provided by any embodiment of the present disclosure. The number of transistors in the gate drive circuit in the display device is small, the pre-charging function may be realized without additionally adding a signal for controlling the pre-charging function, and the circuit structure is simple, which is conducive to realizing narrow bezels and high resolution and reducing the costs. For example, the gate drive circuit in the display device of at least one embodiment may realize the bi-directional scanning function without additionally adding signals for controlling the scanning direction, which is conducive to realizing the arrangement of wires in the narrow bezels.

Figure 9:
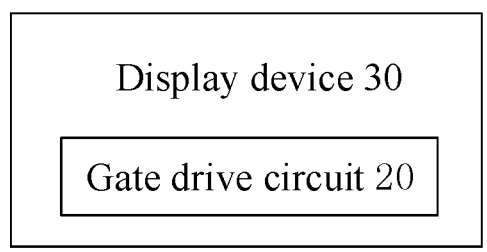
FIG. 9 is a schematic block diagram of a display device provided by an embodiment of the present disclosure.

FIG. 9 is a schematic block diagram of a display device provided by an embodiment of the present disclosure. Referring to FIG. 9, the display device 30 includes a gate drive circuit 20, which is a gate drive circuit provided by any embodiment of the present disclosure.

For example, the display device 30 may be a Liquid Crystal Display (LCD) panel, an LCD television, a display, an organic light-emitting diode (OLED) panel, an OLED television, an electronic paper display device, a mobile phone, a tablet computer, a notebook computer, a digital photo frame, a navigator and any other product or component having a display function, and the embodiments of the present disclosure are not limited thereto. The technical effects of the display device 30 may refer to the corresponding descriptions of the shift register unit 10 and the gate drive circuit 20 in the above embodiment, and will not be described again here.

Figure 10:
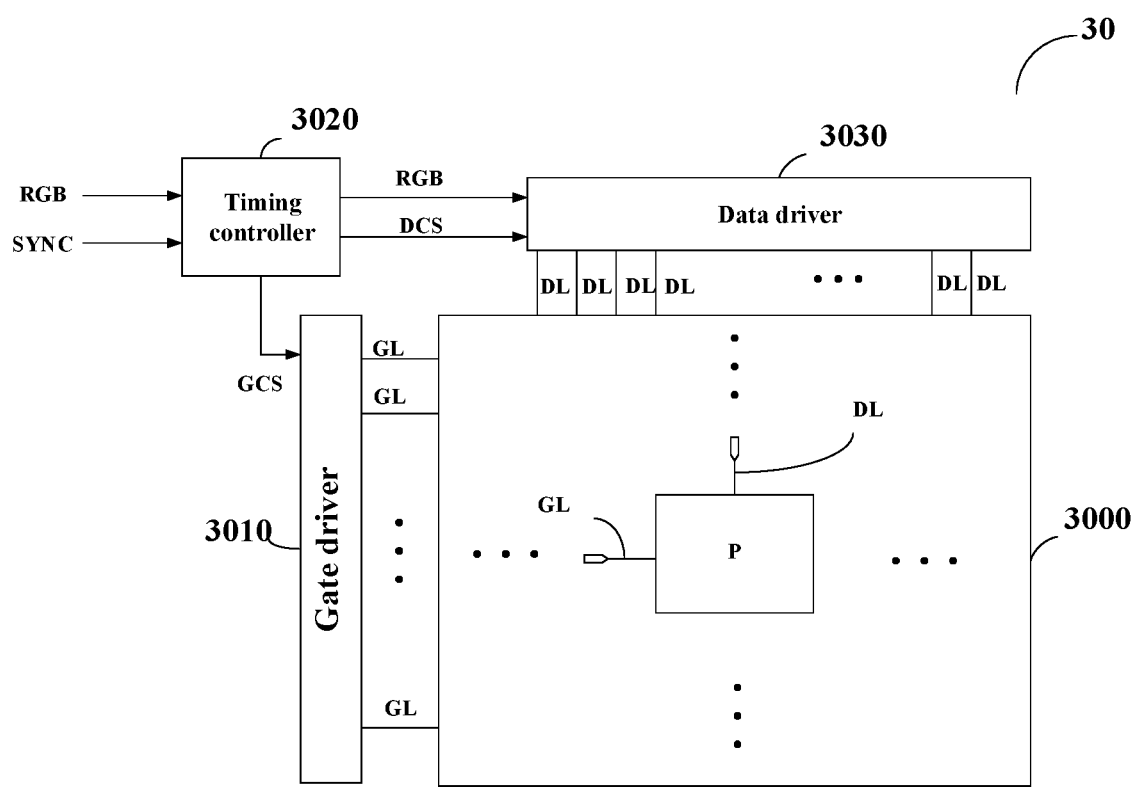
FIG. 10 is a schematic block diagram of another display device provided by an embodiment of the present disclosure.

FIG. 10 is a schematic block diagram of another display device provided by an embodiment of the present disclosure. Referring to FIG. 10, the display device 30 includes a display panel 3000, a gate driver 3010, a timing controller 3020, and a data driver 3030. The display panel 3000 includes a plurality of scan lines GL, a plurality of data lines DL, and a plurality of pixel units P defined according to intersections of the plurality of scan lines GL and the plurality of data lines DL. The gate driver 3010 is used to drive a plurality of scan lines GL. The data driver 3030 is used to drive a plurality of data lines DL. The timing controller 3020 is used to process the image data RGB input from outside the display device 30 and provide the processed image data RGB to the data driver 3030. In addition, the timing controller 3020 is also used to output the scan control signal GCS and the data control signal DCS to the gate driver 3010 and the data driver 3030 to control the gate driver 3010 and the data driver 3030.

For example, the gate driver 3010 includes the gate drive circuit 20 provided in any of the above embodiments. Output terminals of a plurality of shift register units in the gate drive circuit 20 are connected to a plurality of scan lines GL on a one-to-one basis. A plurality of scanning lines GL are correspondingly connected to pixel units P arranged in a plurality of rows. The output terminals Output of the shift register units of individual stages in the gate drive circuit 20 sequentially output signals to a plurality of scanning lines GL to enable the plurality of rows of pixel units P in the display panel 3000 to realize progressive scanning. For example, the gate driver 3010 may be implemented as a semiconductor chip or may be integrated in the display panel 3000 to constitute a GOA circuit.

For example, the data driver 3030 converts digital image data RGB input from the timing controller 3020 into data signals by using a reference gamma voltage based on a plurality of data control signals DCS originating from the timing controller 3020. The data driver 3030 provides converted data signals to the plurality of data lines DL. For example, the data driver 3030 may be implemented as a semiconductor chip.

For example, the timing controller 3020 processes externally input image data RGB to match the size and the resolution of the display panel 3000, and then supplies the processed image data to the data driver 3030. The timing controller 3020 generates a plurality of scan control signals GCS and a plurality of data control signals DCS using synchronization signals (e.g., a dot clock DCLK, a data enable signal DE, a horizontal synchronization signal Hsync, and a vertical synchronization signal Vsync) input from outside the display device 30. The timing controller 3020 provides the generated scan control signal GCS and the data control signal DCS to the gate driver 3010 and the data driver 3030, respectively, for the control of the gate driver 3010 and the data driver 3030.

The display device 30 may also include other components, such as a signal decoding circuit, a voltage conversion circuit, etc. These components may, for example, adopt conventional components, which will not be described in detail here.

At least one embodiment of the present disclosure also provides a driving method of the shift register unit, which may be used to drive the shift register unit provided by any embodiment of the present disclosure. By using the driving method, the pre-charging function may be realized without adding additional signals for controlling the pre-charging function, and the adopted circuit structure is simple, which is conducive to realizing narrow bezels and high resolution and reducing costs. For example, in at least one embodiment, the bidirectional scanning function may be realized without adding additional signals for controlling the scanning direction, which is conducive to realizing the arrangement of wires in the narrow bezels.

For example, in an embodiment, in the case where the shift register unit 10 includes the second output pull-down circuit 700, the driving method of the shift register unit 10 includes the following operations:

In the first phase, the first input circuit 100 charges the pull-up node PU to the first level in response to the first clock signal, and the output circuit 200 outputs the low level of the second clock signal to the output terminal Output;

In the second phase, the output circuit 200 outputs the high level of the second clock signal to the output terminal Output;

In the third phase, the output circuit 200 outputs the high level of the second clock signal to the output terminal Output;

In the fourth phase, the output circuit 200 outputs the low level of the second clock signal to the output terminal Output, and the first output pull-down circuit 300 denoises the output terminal Output in response to the third clock signal;

In the fifth phase, the first input circuit 100 resets the pull-up node PU in response to the first clock signal, and the first output pull-down circuit 300 denoises the output terminal Output in response to the third clock signal;

In the sixth phase, the first input circuit 100 resets the pull-up node PU in response to the first clock signal, and the second output pull-down circuit 700 denoises the output terminal Output under the control of the level of the pull-down node PD.

For example, in the second phase, due to the bootstrap effect of the first capacitor C1, the level of the pull-up node PU changes to the second level, which is higher than the first level. In the third phase, the level of the pull-up node PU is maintained at the second level. In the fourth phase, due to the bootstrap effect of the first capacitor C1, the level of the pull-up node PU becomes the first level. In the fifth phase, the level of the pull-up node PU is pulled down to a low level.

For example, in an example, in the case where the shift register unit 10 further includes the second input circuit 400, the driving method of the shift register unit 10 further includes:

In the seventh phase, the second input circuit 400 denoises the pull-up node PU in response to the fourth clock signal, and the second output pull-down circuit 700 denoises the output under the control of the level of the pull-down node PD.

For example, in the fourth phase, the second input circuit 400 maintains the level of the pull-up node PU at the first level in response to the fourth clock signal.

For example, the first clock signal, the second clock signal, the third clock signal and the fourth clock signal have the same period, the phase of the second clock signal is one quarter of the period later than the phase of the first clock signal, the phase of the fourth clock signal is one quarter of the period later than the phase of the second clock signal, and the phase of the third clock signal is one quarter of the period later than the phase of the fourth clock signal.

For example, in another embodiment, when the display panel adopting the shift register unit 10 is used for the reverse scanning, in the case where the shift register unit 10 includes the second output pull-down circuit 700, the driving method of the shift register unit 10 includes the following operations:

In the first phase, the second input circuit 400 charges the pull-up node PU to the first level in response to the fourth clock signal, and the output circuit 200 outputs the low level of the second clock signal to the output terminal Output;

In the second phase, the output circuit 200 outputs the high level of the second clock signal to the output terminal Output;

In the third phase, the output circuit 200 outputs the high level of the second clock signal to the output terminal Output;

In the fourth phase, the output circuit 200 outputs the low level of the second clock signal to the output terminal Output, and the first output pull-down circuit 300 denoises the output terminal Output in response to the third clock signal;

In the fifth phase, the second input circuit 400 resets the pull-up node PU in response to the fourth clock signal, and the first output pull-down circuit 300 denoises the output terminal Output in response to the third clock signal;

In the sixth phase, the second input circuit 400 resets the pull-up node PU in response to the fourth clock signal, and the second output pull-down circuit 700 denoises the output terminal Output under the control of the level of the pull-down node PD.

For example, in the second phase, due to the bootstrap effect of the first capacitor C1, the level of the pull-up node PU changes to the second level, which is higher than the first level. In the third phase, the level of the pull-up node PU is maintained at the second level. In the fourth phase, due to the bootstrap effect of the first capacitor C1, the level of the pull-up node PU becomes the first level. In the fifth phase, the level of the pull-up node PU is pulled down to a low level.

For example, in one example, when the display panel adopting the shift register unit 10 is used for the reverse scanning, the driving method of the shift register unit 10 further includes:

In the seventh phase, the first input circuit 100 denoises the pull-up node PU in response to the first clock signal, and the second output pull-down circuit 700 denoises the output under the control of the level of the pull-down node PD.

For example, in the fourth phase, the first input circuit 100 maintains the level of the pull-up node PU at the first level in response to the fourth clock signal.

For example, when the display panel adopting the shift register unit 10 is used for the reverse scanning, the first clock signal, the second clock signal, the third clock signal and the fourth clock signal have the same period, the phase of the first clock signal is one quarter of the period later than the phase of the second clock signal, the phase of the third clock signal is one quarter of the period later than the phase of the first clock signal, and the phase of the fourth clock signal is one quarter of the period later than the phase of the third clock signal.

It should be noted that the detailed description and technical effects of the driving method may refer to the corresponding descriptions of the shift register unit 10 and the gate drive circuit 20 in the embodiment of the present disclosure, which are not repeated here.

The following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

The foregoing merely are exemplary embodiments of the disclosure, and not intended to define the scope of the disclosure, and the scope of the disclosure is determined by the appended claims.

What is claimed is:

1. A gate drive circuit comprising the shift register unit, wherein the gate drive circuit comprises a first clock signal line, a second clock signal line, a third clock signal line and a fourth clock signal line, wherein
    the shift register unit comprises a first input circuit, an output circuit and a first output denoising circuit,
    wherein the first input circuit is configured to charge a first node in response to a first clock signal and reset the first node in response to the first clock signal,
    the output circuit is configured to output a second clock signal to an output terminal under a control of a level of the first node, and
    the first output denoising circuit is configured to denoise the output terminal in response to a third clock signal, the first input circuit is connected to a first input terminal, a signal output from the first input terminal and a signal output from the output terminal partially overlap with each other, and overlapping time between the signal output from the first input terminal and the signal output from the output terminal is half of a high-level pulse width of the first clock signal, the shift register unit further comprises a second input circuit, a first clock signal terminal, a second clock signal terminal, a third clock signal terminal, and a fourth clock signal terminal, wherein the first clock signal terminal, the second clock signal terminal, the third clock signal terminal, and the fourth clock signal terminal are configured for inputting the first clock signal, the second clock signal, the third clock signal, and a fourth clock signal into the first input circuit, the output circuit, the first output denoising circuit, and the second input circuit, respectively, the first clock signal terminal of the shift register unit of a (4n-3)th stage is connected with the first clock signal line, the second clock signal terminal of the shift register unit of the (4n-3)th stage is connected with the second clock signal line, the third clock signal terminal of the shift register unit of the (4n-3)th stage is connected with the third clock signal line, and the fourth clock signal terminal of the shift register unit of the (4n-3)th stage is connected with the fourth clock signal line, the first clock signal terminal of the stage shift register unit of a (4n-2)th stage is connected with the second clock signal line, the second clock signal terminal of the (4n-2)th stage shift register unit is connected with the fourth clock signal line, the third clock signal terminal of the (4n-2)th stage shift register unit is connected with the first clock signal line, and the fourth clock signal terminal of the shift register unit of the (4n-2)th stage is connected with the third clock signal line, the first clock signal terminal of the stage shift register unit of a (4n-1)th stage is connected with the fourth clock signal line, the second clock signal terminal of the (4n-1)th stage shift register unit is connected with the third clock signal line, the third clock signal terminal of the shift register unit of the (4n-1)th stage is connected with the second clock signal line, and the fourth clock signal terminal of the shift register unit of the (4n-1)th stage is connected with the first clock signal line, the first clock signal terminal of the shift register unit of a (4n)th stage is connected with the third clock signal line, the second clock signal terminal of the 4n-th stage shift register unit is connected with the first clock signal line, the third clock signal terminal of the 4n-th stage shift register unit is connected with the fourth clock signal line, and the fourth clock signal terminal of the shift register unit of the (4n)th stage is connected with the second clock signal line, and n is an integer greater than 0.

2. A display device comprising the gate drive circuit according to claim 1.

3. The gate drive circuit according to claim 1, wherein the second input circuit is configured to denoise the first node in response to a fourth clock signal.

4. The gate drive circuit according to claim 3, wherein the second input circuit comprises a fourth transistor, a gate of the fourth transistor is configured to be connected to the fourth clock signal terminal to receive the fourth clock signal, a first electrode of the fourth transistor is configured to be connected to the first node, and a second electrode of the fourth transistor is configured to be connected to a second input terminal to receive a second input signal.

5. The gate drive circuit according to claim 1, wherein the shift register unit further comprises a first node control circuit and a second output denoising circuit, wherein the first node control circuit is configured to control a level of a second node under a control of the level of the first node, and the second output denoising circuit is configured to denoise the output terminal under a control of the level of the second node.

6. The gate drive circuit according to claim 5, further comprising a second node control circuit, wherein the second node control circuit is configured to control the level of the second node in response to the second clock signal.

7. The gate drive circuit according to claim 6, wherein the second output denoising circuit comprises a sixth transistor, a gate of the sixth transistor is configured to be connected to the second node, a first electrode of the sixth transistor is configured to be connected to the output terminal, and a second electrode of the sixth transistor is configured to be connected to a first voltage terminal to receive a first voltage.

8. The gate drive circuit according to claim 5, wherein the first node control circuit comprises a fifth transistor;

a gate of the fifth transistor is configured to be connected to the first node, a first electrode of the fifth transistor is configured to be connected to the second node, and a second electrode of the fifth transistor is configured to be connected to a first voltage terminal to receive a first voltage.

9. The gate drive circuit according to claim 1, wherein the first input circuit comprises a first transistor, a gate of the first transistor is configured to be connected to the first clock signal terminal to receive the first clock signal, a first electrode of the first transistor is configured to be connected to the first input terminal to receive a first input signal, and a second electrode of the first transistor is configured to be connected to the first node.

10. The gate drive circuit according to claim 9, wherein the second node control circuit comprises a second capacitor, a first electrode of the second capacitor is configured to be connected to the second node, and a second electrode of the second capacitor is configured to be connected to the second clock signal terminal to receive the second clock signal.

11. The gate drive circuit according to claim 1, wherein the output circuit comprises a second transistor and a first capacitor, a gate of the second transistor is configured to be connected to the first node, a first electrode of the second transistor is configured to be connected to the second clock signal terminal to receive the second clock signal, and a second electrode of the second transistor is configured to be connected to the output terminal, and a first electrode of the first capacitor is configured to be connected to the gate of the second transistor, and a second electrode of the first capacitor is configured to be connected to the second electrode of the second transistor.

12. The gate drive circuit according to claim 1, wherein the first output denoising circuit comprises a third transistor,
a gate of the third transistor is configured to be connected to the third clock signal terminal to receive the third clock signal, a first electrode of the third transistor is configured to be connected to the output terminal, and a second electrode of the third transistor is configured to be connected to a first voltage terminal to receive a first voltage.

13. A driving method of a shift register unit comprising a first input circuit, a second input circuit, an output circuit, a first output denoising circuit and a second output denoising circuit,
wherein the driving method comprises:
in a first phase, charging by the first input circuit a first node to a first level in response to a first clock signal, and outputting by the output circuit a low level of a second clock signal to the output terminal;
in a second phase, outputting by the output circuit a high level of the second clock signal to the output terminal;
in a third phase, outputting by the output circuit the high level of the second clock signal to the output terminal;
in a fourth phase, outputting by the output circuit a low level of the second clock signal to the output terminal, and denoising by the first output denoising circuit the output terminal in response to a third clock signal;
in a fifth phase, resetting by the first input circuit the first node in response to the first clock signal, and denoising by the first output denoising circuit the output terminal in response to the third clock signal;
in a sixth phase, resetting by the first input circuit the first node in response to the first clock signal, and denoising the output terminal by the second output denoising circuit under the control of the level of a second node; and
in a seventh phase, denoising by the second input circuit the first node in response to a fourth clock signal, and denoising by the second output denoising circuit the output terminal under the control of the level of the second node.

14. The driving method according to claim 13, wherein the first clock signal, the second clock signal, the third clock signal, and the fourth clock signal have a same period, a phase of the second clock signal is one quarter of the period later than a phase of the first clock signal, a phase of the fourth clock signal is one quarter of the period later than the phase of the second clock signal, and a phase of the third clock signal is one quarter of the period later than the phase of the fourth clock signal.

15. A driving method of a shift register unit,
wherein the shift register unit comprises a first input circuit, an output circuit, a first output denoising circuit, a second input circuit and a second output denoising circuit,
wherein the driving method comprises:
in a first phase, charging by the second input circuit a first node to a first level in response to a fourth clock signal, and outputting by the output circuit a low level of a second clock signal to an output terminal;
in a second phase, outputting by the output circuit a high level of the second clock signal to the output terminal;
in a third phase, outputting by the output circuit the high level of the second clock signal to the output terminal;
in a fourth phase, outputting by the output circuit the low level of the second clock signal to the output terminal, and denoising by the first output denoising circuit the output terminal in response to a third clock signal;
in a fifth phase, resetting by the second input circuit the first node in response to the fourth clock signal, and denoising by the first output denoising circuit the output terminal in response to the third clock signal;
in a sixth phase, resetting by the second input circuit the first node in response to the fourth clock signal, and denoising the output terminal by the second output denoising circuit under the control of the level of a second node; and
in a seventh phase, denoising by the first input circuit the first node in response to the first clock signal, and denoising by the second output denoising circuit the output terminal under the control of the level of the second node.

16. The driving method according to claim 15, wherein the first clock signal, the second clock signal, the third clock signal, and the fourth clock signal have a same period, a phase of the first clock signal is one quarter of the period later than a phase of the second clock signal, a phase of the third clock signal is one quarter of the period later than the phase of the first clock signal, and a phase of the fourth clock signal is one quarter of the period later than the phase of the third clock signal.

* * * * *